United States Patent [19]

Tam

[11] Patent Number: 5,120,903
[45] Date of Patent: Jun. 9, 1992

[54] ELECTROMAGNETIC SHIELDING MEMBER

[75] Inventor: Khing H. Tam, Nagoya, Japan

[73] Assignee: Kitagawa Industries Co., Ltd., Japan

[21] Appl. No.: 684,337

[22] Filed: Apr. 12, 1991

[30] Foreign Application Priority Data

Aug. 6, 1990 [JP] Japan .................................. 2-208914

[51] Int. Cl.$^5$ .............................................. H05K 9/00
[52] U.S. Cl. ......................... 174/35 GC; 174/35 MS; 277/901
[58] Field of Search ............... 277/227, 228, 229, 230, 277/235 R, 901; 174/35 R, 35 GC, 35 MS; 219/10.55 D, 10.55 R; 361/424

[56] References Cited

U.S. PATENT DOCUMENTS

| Re. 33,256 | 7/1990 | Busby | 174/35 GC |
| 4,659,869 | 4/1987 | Busby | 174/35 GC |
| 4,794,218 | 12/1988 | Nakano et al. | 219/10.55 D |
| 4,820,885 | 4/1989 | Lindsay | 174/35 GC |
| 4,857,668 | 8/1989 | Budnanno | 174/35 GC |
| 4,866,213 | 9/1989 | Lindsay | 174/35 GC |
| 4,968,854 | 11/1990 | Benn, Sr. et al. | 174/35 GC |

FOREIGN PATENT DOCUMENTS 2218264 11/1989 United Kingdom .

OTHER PUBLICATIONS

Nuccio et al, Conductive Seal for E.M. Shield, IBM Technical Disclosure Bulletin, vol. 20, No. 1, Jun. 1977.

Primary Examiner—Leo P. Picard
Assistant Examiner—Bot Ledinh
Attorney, Agent, or Firm—Davis, Bujold & Streck

[57] ABSTRACT

In an electromagnetic shielding member, an upper structure and a lower structure are connected integrally by attaching a connecting member covered with a conductive member onto the gripping member of the lower structure. A thin metal strip is inserted as the connecting member between the upper structure and the lower structure. Since the upper structure provides a sufficient resilience against a cover member of an enclosure to which the electromagnetic shielding member is fitted, the gap between the cover member and the enclosure is small, thereby enhancing an electromagnetic shielding effect. The lower structure has a double coated adhesive tape to connect to the enclosure. Instead of using the double coated adhesive tape, the lower structure can have a cavity for receiving an edge of the enclosure at its wall surface. When the enclosure edge engages the cavity of the lower structure, a spring member in the cavity of the lower structure deflects according to the thickness of the edge. The spring member urges the electromagnetic shielding member against the material of the enclosure edge. The electromagnetic shielding member is thus easily and firmly secured onto the enclosure.

20 Claims, 9 Drawing Sheets

ELECTROMAGNETIC SHIELDING MEMBER

BACKGROUND OF THE INVENTION

This invention relates to an electromagnetic-shielding member attached to a housing or other enclosing structure to shield the structure from electromagnetic interference radiation.

Various electromagnetic-shielding members are attached onto an opening in an enclosure to securely shield the enclosure from electromagnetic interference radiation when the opening is closed with a cover member. Electromagnetic-shielding members are known in the art, for example, one is disclosed in U.K. Published Unexamined Patent Application No. 2218264. In this prior art reference, as shown in FIG. 11, the sides of a shielding gasket P1, which is cylindrical and resilient, are held by a carrier P2. The carrier P2 is fixed onto a surface P4 by means of an adhesive layer P3.

The electromagnetic-shielding member of FIG. 11, however, cannot ensure sufficient shielding effect when used on an opening in the enclosure. Specifically, the carrier P2 extends upward and grips the shielding gasket P1 in position. Therefore, when a cover member presses the shielding gasket P1 to close the opening, the cover member touches the edges of the carrier P2 and only part of the shielding gasket P1 can be deflected. Consequently, the shielding gasket P1 over the opening in the enclosure provides insufficient resilience and only insufficient electromagnetic-shielding effect is expected. As another negative feature, the shielding gasket P1 occupies a large space, thereby making an enclosure receiving the shielding gasket P1 large-sized as well.

SUMMARY OF THE INVENTION

Wherefore, an object of this invention is to provide an electromagnetic-shielding member that occupies only a small space, thereby making an opening in an enclosure receiving the electromagnetic-shielding member more compact.

Other objects and benefits of the invention will become apparent from the detailed description which follows hereinafter when taken in conjunction with the drawing figures which accompany it.

To solve this and other objects, this invention provides a new electromagnetic-shielding member. The electromagnetic-shielding member comprises an upper structure comprising a resilient core member and a conductive member surrounding the periphery of the resilient core member, and a lower structure connected integrally to the upper structure. The electromagnetic-shielding member also comprises a connecting plate member attached to the bottom surface of the resilient core member, surrounded integrally with the resilient core member by the conductive member and projecting from the bottom surface. The electromagnetic-shielding member further comprises gripping members formed at both side edges of the lower structure for respectively gripping both side edges of the conductive member and the connecting plate member.

This invention also provides an electromagnetic-shielding member that comprises a lower structure comprising an upper board member having the gripping members, a lower board member, and a connecting member for connecting the upper and lower board members. The upper and lower board members and the connecting member form a cavity. The cavity receives a spring member provided on either one of the upper and lower board members for projecting toward the other opposing board member.

This invention further provides an electromagnetic-shielding member that comprises a lower structure comprising the upper board member having the gripping members and a pair of limb members extending downward from the upper board member. The pair of limb members form a cavity. The cavity receives a spring member provided on either one of the limb members for projecting toward the other opposing limb member.

The resilient core member can be made of silicone sponge, rubber, or the like, and can have a cross section which is rectangular, triangular, circular, donut-shaped, or of other configuration. The conductive member can be made of any conductive material such as fine steel knitted wire mesh, or nylon fabric covered with silver or other conductive metal. The lower structure can be made of an extruded aluminum, other metal, conductive resin or other material. The lower structure can be attached to a housing or other enclosing member by means of a conductive double coated adhesive tape, adhesive, or the like.

DETAILED DESCRIPTION OF THE PREFERRED EMBODIMENTS

Figure 1:
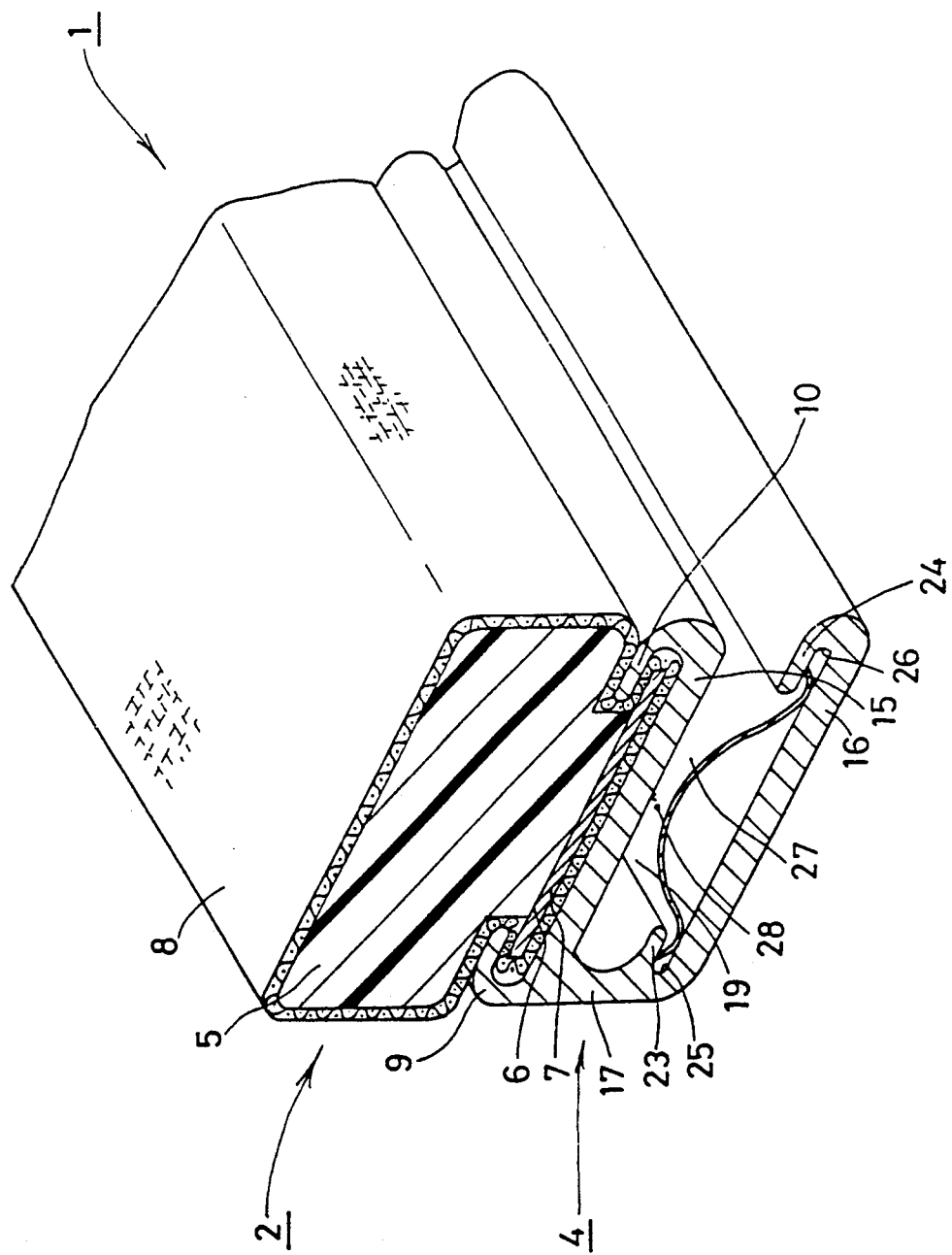
FIG. 1 is a partially sectional perspective view of an electromagnetic-shielding member for a first embodiment of the invention.
Figure 3:
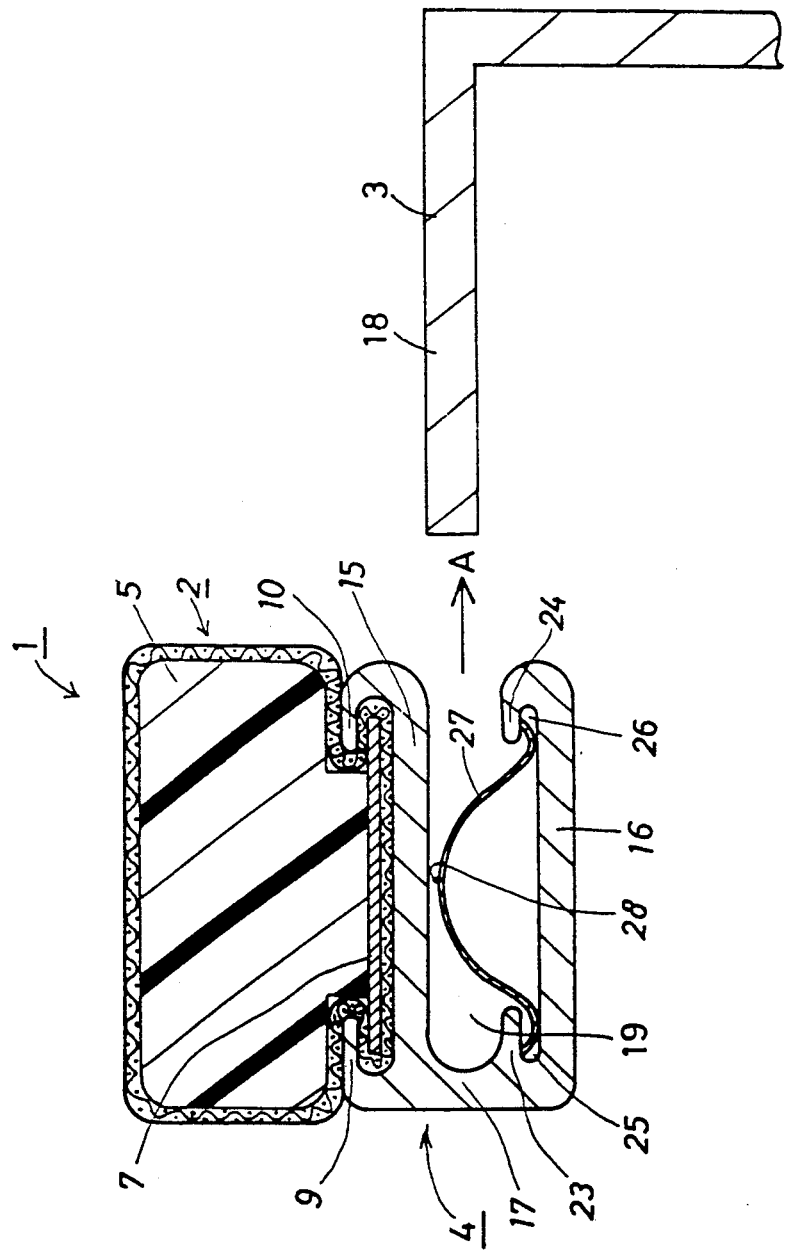
FIGS. 3 and 4 are cross-sectional views of the electromagnetic-shielding member in use.

As shown in FIG. 1, an electromagnetic shield 1 for the first embodiment comprises a gasket portion 2 and a mounting portion 4 for connecting the gasket portion 2 onto an enclosure 3 as shown in FIG. 3. The gasket portion 2 is resilient and provides an electromagnetic-shielding effect. The gasket portion 2 has a core element 5 therein. The core element 5 is made of silicone sponge or rubber and is resilient. The core element 5 has a bottom 6 for contacting an insert 7 which is made strongly resilient of metal, resin, or other material. A knitted wire mesh 8 is made of fine flexible iron wire and covers the outer periphery of the core element 5 and the insert 7.

Figure 2:
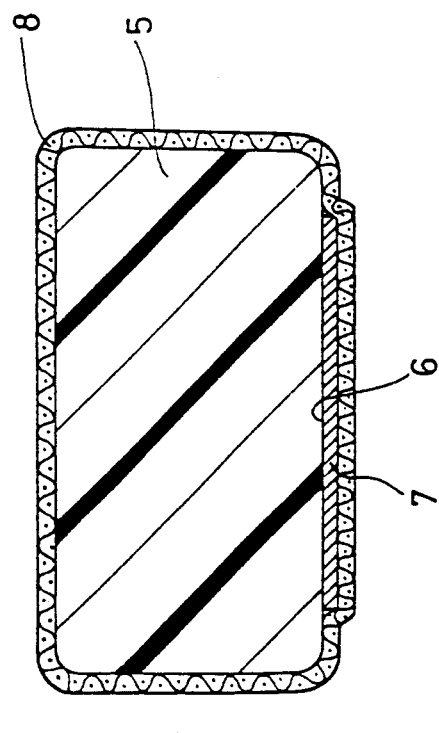
FIG. 2 is a cross-sectional view of an upper structure of the electromagnetic-shielding member.

As shown in FIG. 2, the insert 7 is narrower than the bottom 6 of the core element 5 before the gasket portion 2 is attached onto the mounting portion 4. As shown in FIG. 1, when the gasket portion 2 is attached onto the mounting portion 4, the bottom 6 of the core element 5 is gripped by jaws 9 and 10 described later. Consequently, the bottom 6 becomes narrower and the insert 7 becomes wider than the bottom 6.

Figure 4:
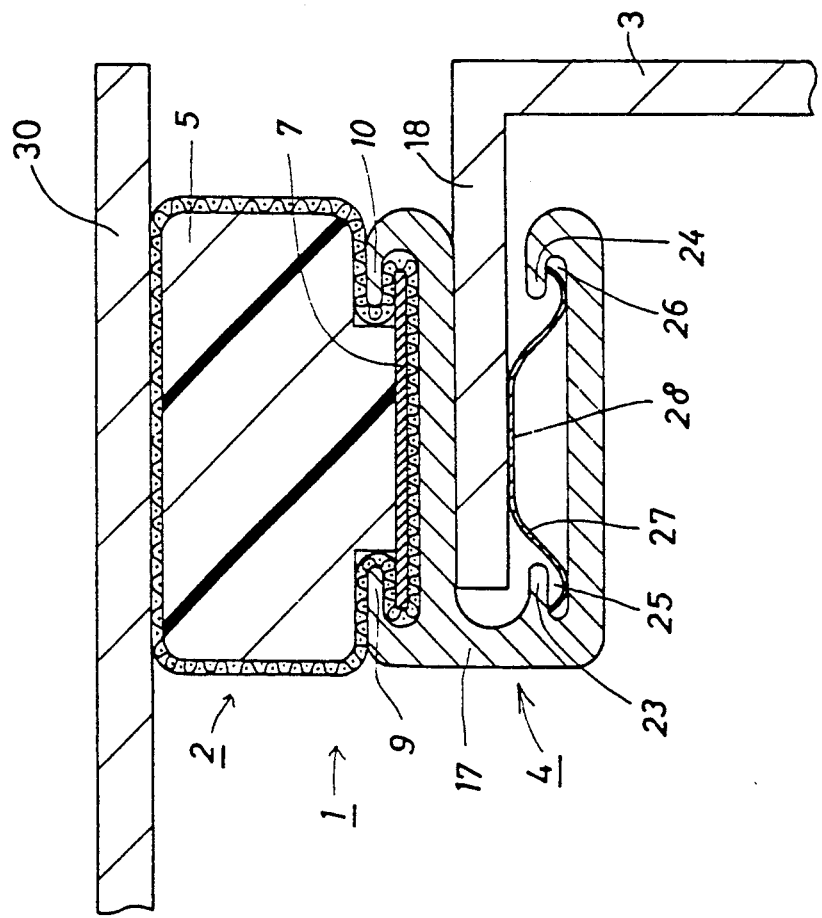

As shown in FIG. 4, the mounting portion 4 is preferably made of extruded aluminum. The mounting portion 4 is formed almost into a U shape by a pair of upper and lower boards 15 and 16 and a joint 17 for connecting the upper and lower boards 15 and 16. The upper and lower boards 15 and 16 and the joint 17 thus form a cavity 19. As shown in FIG. 4, when the electromagnetic shield 1 is mounted onto the enclosure 3, the cavity 19 engages a frame edge 18. Both sides of the upper board 15 of the mounting portion 4 extend upward to form the jaws 9 and 10 extending parallel the upper board 15. By gripping the insert 7, the jaws 9 and 10 connect the gasket portion 2 and the mounting portion 4 integrally. On the other hand, both sides of the lower board 16 of the mounting portion 4 extend upward to form jaws 23 and 24 extending parallel the lower board 16. The jaws 23 and 24 form indentations 25 and 26, respectively, for slidably receiving both side edges of an elongated leaf spring 27. The preferred spring 27 is made of stainless steel and is gradually curved upward at the middle thereof. Both side edges of the spring 27 are curved downward once, extend slightly upward again, and are held in the indentations 25 and 26. Preferably, sharp teeth 28 are formed at intervals on top of the spring 27 by a punch or other tool. The sharp teeth 28 firmly bite the undersurface of the frame edge 18 of the enclosure 3.

In operation, as shown in FIGS. 3 and 4, the electromagnetic shield 1 is attached onto the enclosure 3 by pressing the mounting portion 4 in the direction shown by an arrow A toward the frame edge 18. As shown in FIG. 4, when the cavity 19 receives the frame edge 18, the spring 27 deflects according to the thickness of the frame edge 18. Therefore, just by pressing the mounting portion 4 in the direction shown by the arrow A, the electromagnetic shield 1 can be attached easily. When the mounting portion 4 engages the frame edge 18, the spring 27 presses the underside of the frame edge 18 to securely hold the frame edge 18 in position. Subsequently, when a lid 30 is closed, the electromagnetic shield 1 completely shields the enclosure 3 from electromagnetic interference radiation.

Figure 5:
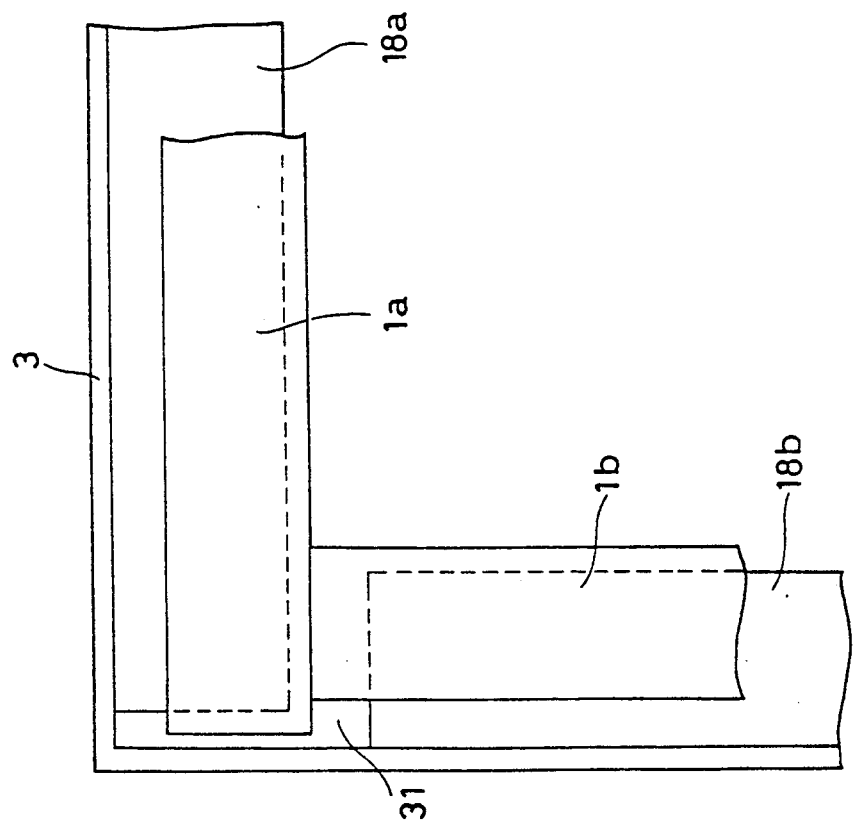
FIG. 5 is an explanatory view showing the application of the electromagnetic-shielding member onto a corner of a frame edge.

As shown in FIG. 5, the electromagnetic shield 1 of this invention can be attached easily onto a corner of the enclosure 3 for forming a tight joint at the corner. Specifically, a notch 31 is formed by cutting a part of the frame edge 18 to form an L-shaped corner in the enclosure 3. An electromagnetic shield 1a is first fixed onto a frame edge 18a having no notch. Subsequently, another electromagnetic shield 1b is fixed onto a frame edge 18b having the notch 31 so that the electromagnetic shield 1b closely adjoins the electromagnetic shield 1a. Thus, the electromagnetic shields 1a and 1b can be attached onto the corner of the enclosure 3 and can shield the corner completely from electromagnetic interference radiation.

In the foregoing embodiment, the gasket portion 2 includes the insert 7 covered with the knitted wire mesh 8. Since the insert 7 is a thin member only used for connecting the gasket portion 2 and the mounting portion 4, the core element 5 forms most part of the electromagnetic shield 1, thereby providing maximum electromagnetic shielding effect. The electromagnetic shield 1 ensures sufficient resilience to shield the opening of the enclosure 3, occupies minimum space in the opening of the enclosure 3, and provides an effective electromagnetic shielding.

Just by pressing the mounting portion 4 onto the frame edge 18 of the enclosure 3 as described above, the electromagnetic shield 1 can be attached to the enclosure 3 easily and smoothly. When the electromagnetic shield 1 is attached to the enclosure 3, the spring 27 as compressed in the cavity 19 of the mounting portion 4 presses the underside of the frame edge 18 so that the electromagnetic shield 1 is firmly held in position.

Note also that since the gasket portion 2 can be detachably attached to the mounting portion 4, the mounting portion 4 of a specific configuration can receive a variety of the gasket portion 2 according to the application thereof.

When the electromagnetic shield 1 engages the frame edge 18, the sharp teeth 28 formed on top of the spring 27 bite the surface of the frame edge 18 and provides electrical continuity from the gasket portion 2 to the frame edge 18 to which the mounting portion 4 is fitted. The function of the electromagnetic shield 1 is thus enhanced.

If desired, the mounting portion 4 can be formed into multiple short strips. The spring 27 can receive multiple strips of the mounting portion 4. In operation, only some strips of the mounting portion 4 are needed to receive the gasket portion 2, thereby saving material. If worn out or broken, the gasket portion 2 and the mounting portion 4 are both easily replaceable.

FIGS. 6 through 10 show electromagnetic shields of second through sixth embodiments, respectively. The gasket portion 2 of the first embodiment is the same as that of the second through sixth embodiments. Therefore, the gasket portion 2 is omitted from FIGS. 6 through 10 in the interest of simplicity. FIGS. 6 through 10, therefore, show only the mounting portion of each electromagnetic shield.

Figure 6:
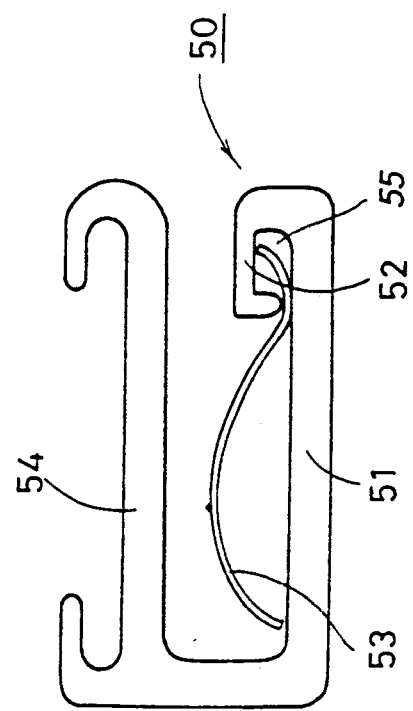
FIGS. 6 through 9 are end views of lower structures of electromagnetic-shielding members for second through fifth embodiments, respectively.

As shown in FIG. 6, in the second embodiment, a mounting portion 40 comprises an upper board 41 having indentations 45 and 46 for slidably receiving both side edges of an elongated leaf spring 42 opposing a lower board 43.

Figure 7:
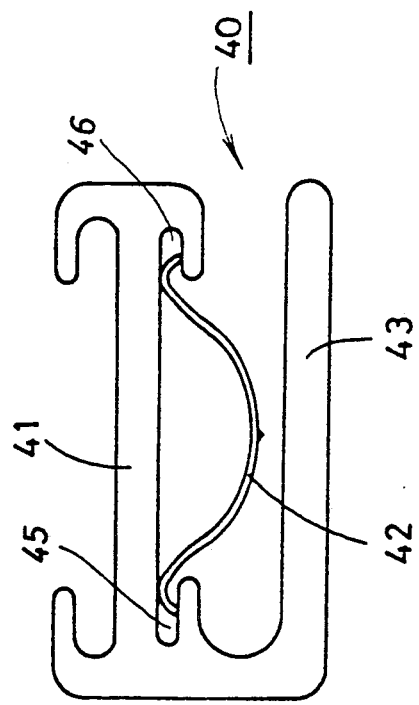

As shown in FIG. 7, in the third embodiment, a mounting portion 50 comprises a lower board 51 having an indentation 55 at one side edge a single jaw 52 for slidably receiving and holding one side edge of a curved spring 53 opposing an upper board 54.

Figure 8:
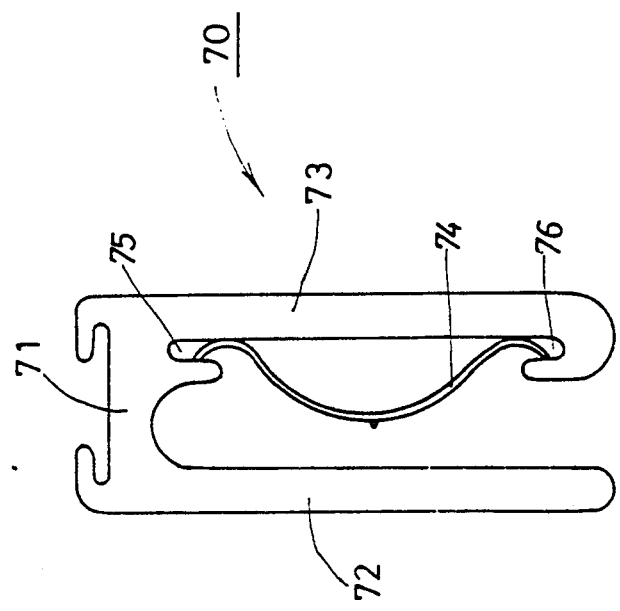

As shown in FIG. 8, in the fourth embodiment, a mounting portion 60 comprises an upper board 61. A pair of limbs 62 and 63 extends downward perpendicularly from the underside of the upper board 61. The one limb 62 has indentations 65 and 66 for slidably receiving both side edges of an elongated leaf spring 64 opposing the other limb 63.

Figure 9:
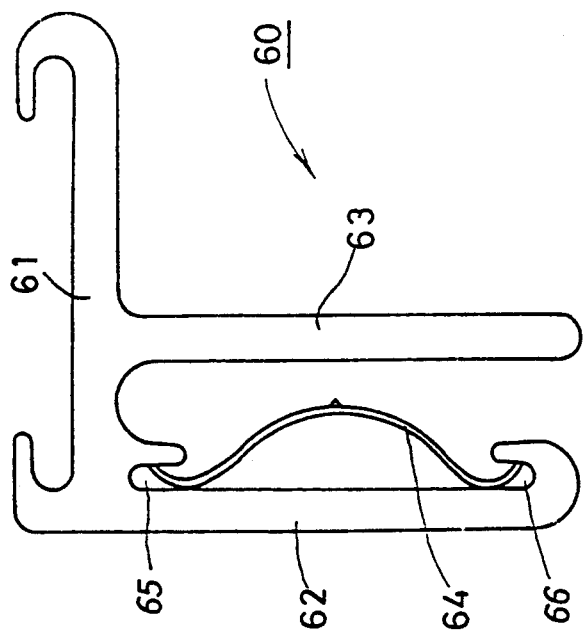

As shown in FIG. 9, in the fifth embodiment, a mounting portion 70 comprises an upper board 71. A pair of limbs 72 and 73 extends downward perpendicularly from the underside of the upper board 71. The structure of the fifth embodiment is substantially the same as that of the fourth embodiment except that the width of the upper board 71 is the same as the interval between the limbs 72 and 73. As in the fourth embodiment, the one limb 73 has indentations 75 and 76 for slidably receiving both side edges of an elongated leaf spring 74 opposing the other limb 72.

In the same way as the first embodiment, the electromagnetic shields of the second through fifth embodiments can be attached to both vertical and horizontal frame edges 18, as appropriate to the embodiment, quickly and easily so as to provide effective electromagnetic shielding. As those skilled in the art will readily recognize and appreciate, the electromagnetic shields of the fourth and fifth embodiments are intended to be attached to vertical frame edges 18 while the other embodiments are intended for horizontal frame edges 18.

Figure 10:
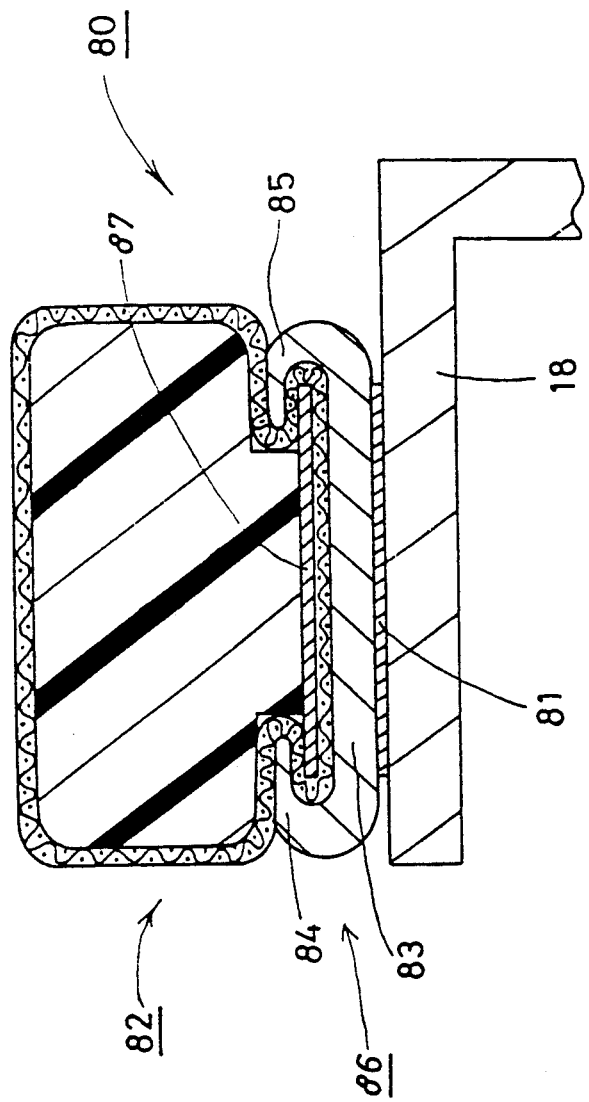
FIG. 10 is a cross-sectional view of an electromagnetic-shielding member for a sixth embodiment showing the application thereof.
Figure 11:
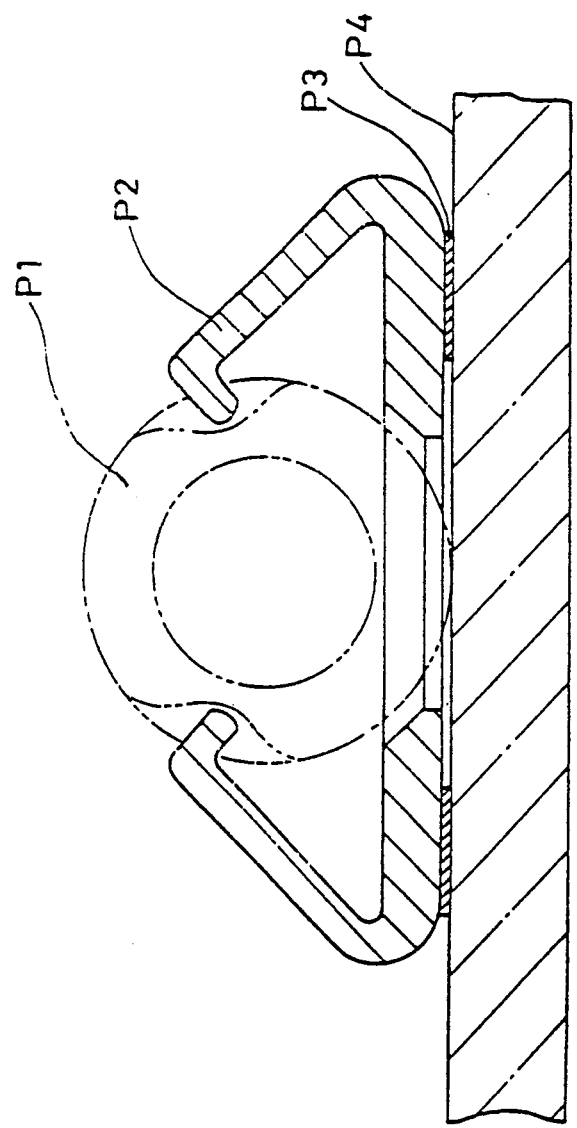
FIG. 11 is a cross-sectional view of a prior art electromagnetic-shielding member.

By contrast to the electromagnetic shields of the first through fifth embodiments, in the sixth embodiment shown in FIG. 10, an electromagnetic shield 80 is attached to the frame edge 18 using a double coated adhesive tape 81, instead of mechanically engaging the mounting portion with the frame edge 18. The electromagnetic shield 80 comprises a gasket portion 82 corresponding to the gasket portion 2 of the first embodiment and a mounting portion 86 comprising a board 83 having jaws 84 and 85 on opposite edges for gripping an insert 87. By applying the double coated adhesive tape 81 onto the underside of the board 83, the electromagnetic shield 80 can be fixed onto the frame edge 18. To be effective, the double coated adhesive tape 81 is conductive. The board 83 of the mounting portion 86 can be fixed onto the frame edge 18 (or a surface of the enclosure removed from an edge) with a conductive adhesive material, if desired, instead of using the double coated adhesive tape 81.

This invention has been described above with reference to several embodiments as shown in the drawings. Modifications and alterations may become apparent to one skilled in the art upon reading and understanding the specification. Despite the use of specific embodiments for illustration purposes, however, it is intended to include all such modifications and alterations within the scope and spirit of the appended claims.

It should also be noted that in the embodiments as shown and described, the core element 5 of the gasket portions 2 and 82 has a rectangular section. The core element 5, however, could have a cross section in any desired and applicable shape such as triangular, circular, or doughnut-shaped. Also, a silver-clad nylon fabric or other such material could be used as a conductive member instead of the knitted wire mesh.

Wherefore, having thus described the present invention, what is claimed is

1. An electromagnetic-shielding member comprising:
    a) a gasket portion comprising,
        a1) a resilient core member,
        a2) a flexible conductive member surrounding a periphery of said resilient core member;
        a3) a thin plate member disposed upon a bottom surface of said resilient core member; and,
    b) a mounting portion connected integrally to said gasket portion comprising a conductive connecting plate member having gripping members along parallel side edges thereof, said gripping members gripping said flexible conductive member with side edges of said thin plate member disposed therebetween; said mounting portion comprising,
        b1) an upper board member;
        b2) a lower board member;
        b3) a connecting member for connecting said upper board member and said lower board member along a side edge thereof to form a cavity between said upper board member, said lower board member, and said connecting member; and
        b4) a spring member disposed within said cavity and carried by one of said upper board member and said lower board member and projecting toward one another of said upper board member and said lower board member.

2. The electromagnetic-shielding member of claim 1 wherein:
    said upper board member is said conductive connecting plate member and has said gripping members whereby the electromagnetic-shielding member can be mounted to a horizontal frame edge.

3. The electromagnetic-shielding member of claim 1 wherein:
    said connecting member is said conductive connecting plate member and has said gripping members whereby the electromagnetic-shielding member can be mounted to a vertical frame edge.

4. The electromagnetic-shielding member of claim 1 wherein:
    said one of said upper board member and said lower board member carrying said spring member includes indentations along side edges thereof for slideably receiving and gripping side edges of said spring member.

5. The electromagnetic-shielding member of claim 1 wherein:
    said spring member includes sharp teeth means formed on a top surface thereof for biting into a surface of a frame edge to which said mounting portion is fitted and providing electrical continuity from said gasket portion to said frame edge.

6. The electromagnetic-shielding member of claim 1 wherein said mounting portion additionally comprises:
    electrically conductive adhesive means disposed between said connecting plate member and a frame member to which said mounting portion is attached for holding said mounting portion to said frame member and for providing electrical continuity from said gasket portion to said frame member.

7. An electromagnetic shielding member comprising:
    a) a gasket portion comprising,
        a1) a resilient core member,
        a2) a flexible conductive member surrounding a periphery of said resilient core member;
        a3) a thin plate member disposed upon a bottom surface of said resilient core member; and,
    b) a mounting portion connected integrally to said gasket portion comprising a conductive connecting plate member having gripping members along parallel side edges thereof, said gripping members gripping said flexible conductive member with side edges of said thni plae member disposed therebetween;
    said thin plate member of said gasket portion being surrounded integrally with a portion of said resilient core member and said gripping members also gripping said portion of said resilient core member.

8. The electromagnetic-shielding member of claim 1 wherein:
    said flexible conductive member is a wire mesh.

9. The electromagnetic-shielding member of claim 1 wherein:
    said flexible conductive member is a metal-clad fabric.

10. The electromagnetic-shielding member of claim 9 wherein:
    said metal-clad fabric is silver-clad nylon.

11. An electromagnetic-shielding member for attaching to a frame edge of an enclosure comprising:
    a) a gasket member comprising, a1) a resilient core member, a2) a flexible conductive member surrounding a periphery of said resilient core member;

a3) a thin plate member disposed along a bottom surface of said resilient core member within said flexible conductive member; and, b) a mounting member having, b1) gripping means along parallel side edges thereof for gripping said flexible conductive member with side edges of said thin plate member disposed therebetween, and b2) means for attaching said mounting member to the frame edge.

12. The electromagnetic-shielding member of claim 11 wherein said mounting member comprises:

a) an upper board member;

b) a lower board member; and, c) a connecting member for connecting said upper board member and said lower board member along a side edge thereof to form a cavity between said upper board member, said lower board member, and said connecting member; and said means for attaching said mounting member to the frame edge comprise, d) a spring member disposed within said cavity and carried by one of said upper board member and said lower board member and projecting toward another of said upper board member and said lower board member.

13. The electromagnetic-shielding member of claim 12 wherein:

said upper board member has said gripping means whereby the electromagnetic-shielding member can be mounted to a horizontal frame edge.

14. The electromagnetic-shielding member of claim 12 wherein:

said connecting member has said gripping means whereby the electromagnetic-shielding member can be mounted to a vertical frame edge.

15. The electromagnetic-shielding member of claim 12 wherein:

said one of said upper board member and said lower board member carrying said spring member includes indentations along side edges thereof for slideably receiving and gripping side edges of said spring member.

16. The electromagnetic-shielding member of claim 12 wherein:

said spring member includes sharp teeth means formed on a top surface thereof for biting into a surface of a frame edge to which said mounting member is fitted and providing electrical continuity from said gasket member to said frame edge.

17. The electromagnetic-shielding member of claim 11 wherein said means for attaching said mounting member to the frame edge comprises:

electrically conductive adhesive means disposed between said mounting member and a frame member to which said mounting member is attached for holding said mounting member to said frame member and for providing electrical continuity from said gasket member to said frame member.

18. The electromagnetic-shielding member of claim 11 wherein:

said thin plate member of said gasket member is surrounded integrally with a portion of said resilient core member and said gripping means also grips said portion of said resilient core member.

19. The electromagnetic-shielding member of claim 11 wherein:

said flexible conductive member is a wire mesh.

20. The electromagnetic-shielding member of claim 11 wherein:

said flexible conductive member is a metal-clad fabric.

* * * * *